United States Patent
Jenq et al.

(10) Patent No.: US 7,393,786 B2
(45) Date of Patent: Jul. 1, 2008

(54) METHOD FOR MANUFACTURING COPPER WIRES ON SUBSTRATE OF FLAT PANEL DISPLAY DEVICE

(75) Inventors: Shrane-Ning Jenq, Hsinchu (TW); Hung-Wei Li, Hsinchu (TW); Min-Sheng Chu, Tao Yuan Shien (TW); Chi-Chao Wan, Hsinchu (TW); Yung-Yun Wang, Hsinchu (TW); Po-Tsun Liu, Hsinchu (TW)

(73) Assignee: Quanta Display Inc., Tao Yuan Shien (TW)

(*) Notice: Subject to any disclaimer, the term of this patent is extended or adjusted under 35 U.S.C. 154(b) by 234 days.

(21) Appl. No.: 11/446,205

(22) Filed: Jun. 5, 2006

(65) Prior Publication Data

US 2007/0128857 A1      Jun. 7, 2007

(30) Foreign Application Priority Data

Dec. 6, 2005     (TW) .............................. 94142880 A

(51) Int. Cl.
*H01L 21/44* (2006.01)

(52) U.S. Cl. ....................................... 438/687; 438/678

(58) Field of Classification Search .................. 438/687, 438/674, 675, 678, 643
See application file for complete search history.

(56) References Cited

U.S. PATENT DOCUMENTS 6,495,005 B1 *  12/2002  Colgan et al. ........... 204/224 R

* cited by examiner

*Primary Examiner*—Tuan H Nguyen
(74) *Attorney, Agent, or Firm*—Bacon & Thomas, PLLC

(57) ABSTRACT

A method for manufacturing copper wires on a substrate for a flat panel display device is disclosed. The method comprises following steps: providing a substrate; forming a seed layer on the surface; forming a patterned photoresist on the surface of the seed layer to expose a part of the seed layer; and plating a copper layer on the exposed part of the seed layer. As the copper layer is plated, an electrolyte solution comprises a sulfur-containing compound is used. The angle between the surface of the copper layer and the contact surface of the seed layer is greater than 0 degree and less than 90 degree. Through the method illustrated above, the film step-coverage in the following process can be improved, the generated voids in device can be reduced, the manufacturing steps can be simplified, and the complicated etching process can be avoided.

20 Claims, 4 Drawing Sheets

METHOD FOR MANUFACTURING COPPER WIRES ON SUBSTRATE OF FLAT PANEL DISPLAY DEVICE

BACKGROUND OF THE INVENTION

1. Field of the Invention

The present invention relates to a method for manufacturing copper wires on a substrate of a flat panel display device and, more particularly, to a method for manufacturing electrodes or conductive lines made of copper of a thin film transistor on a substrate of a flat substrate display device.

2. Description of Related Art

To improve the signal transmission speed of a driving signal for a thin film transistor and to meet the requirements of large panel size and high picture quality for a flat panel display device, copper of the low resistance is used as metal conductive lines or gate electrodes on a flat panel display device to solve the problem of delayed driving signals.

However, many problems such as oxidation, moisture corrosion, poor adhesion, and diffusion between layers need to be solved for the application of the copper wires on the substrate of the flat panel display devices. So far, these problems are improved by the multilayered copper wires. Unfortunately, the multilayered copper wires also increase the difficulty of the following etching process.

On the other hand, it is known that the key point of improving the yield of the active matrix thin film transistor is to control the taper angle of thin films on the substrate. In the conventional method for manufacturing these substrates, the taper angle defined by etching process usually exceeds the tolerant range. Therefore, the taper angle is controlled by adjusting the conditions of the etching process. For example, the taper angle is controlled through applying special etching solution in wet etching, or applying special gas in dry etching under some specific process conditions.

For the etching of the multilayered metal (e.g. Ti—Cu—Ti), the etched width of each metal layer is different since the etching rate for each metal layer is different. This also results in the formation of voids between layers, or poor step-coverage in the following process. Furthermore, the difficulty in controlling of the etching process conditions could bring about short between copper wires, damage to the active channel, or even the disablement for the devices.

U.S. Pat. No. 6,887,776 discloses a method for manufacturing the thin film transistor. The method is achieved by depositing a metal layer of a thin film transistor by electroplating. The flowchart of the method for depositing a metal layer of a thin film transistor is shown in FIG. 1. The method is achieved by depositing a seed layer 210 on a substrate 200 first. The method is subsequently processed by forming a patterned photoresist 220 on the surface of the seed layer 210 to expose partial surface of the seed layer (shown in FIG. 1(a)), and electroplating a metal layer 230 on the exposed surface of the seed layer (shown in FIG. 1(b)). Finally, the photoresist is removed to produce a metal layer structure 230 shown in FIG. 1(c). However, this method cannot naturally form a metal layer with a taper angle, and so the problems caused by etching process (e.g. the short between conductive metal lines, or the damage to active channel) still need to be overcome.

Therefore, it is desirable to provide an improved method to manufacture electrodes or conductive lines made of copper with tapers on the substrate. Through the improved method, the shape of the conductive thin films can therefore be modified, the film step-coverage in the following process can be improved, the generated voids in device can be reduced, the manufacturing steps can be simplified, the complicated etching process can be avoided, and yield of the flat panel display devices can be increased.

SUMMARY OF THE INVENTION

The present invention provides a method for manufacturing copper wires having tapers with an electrolyte solution comprising sulfide. The method for manufacturing conductive copper wires of the present invention can increase the step-coverage of the subsequent process, prevent the formation of voids between layers, and simplify the process to control the taper angles of the copper wires.

The method for manufacturing copper wires on a substrate of a display device of the present invention includes the following steps: providing a substrate; forming a seed layer on the surface of the substrate; forming a patterned photoresist layer on the surface of the seed layer to expose a part of the seed layer; and plating a copper layer on the exposed part of the seed layer with a electrolyte solution comprising a sulfur-containing compound. Besides, the electrolyte solution used to platting the copper layer comprises a sulfur-containing compound.

Furthermore, the angle between the surface of the copper layer and the contact surface of the seed layer is greater than 0 degree and less than 90 degree. Preferably, the angle is greater than 10 degree and less than 80 degree. More preferably, the angle is greater than 30 degree and less than 90 degree.

In one embodiment of the present invention, two angles between the surface of the copper layer and the contact surface of the seed layer are located at the lateral side of the copper layer, and are greater than 0 degree and less than 90 degree. In one preferred embodiment, the two angles located at the lateral side of the copper layer are greater than 10 degree and less than 80 degree. The degrees of the angles can be different, very similar, or identical.

Compared with the conventional method, the method of the present invention is simple. Moreover, the short of the metal copper wires can be prevented, and the damage of operation channel of the device can also be prevented because no etching process is needed. Hence, the cost for manufacturing can be reduced.

The electrolyte solution used in the process of plating a copper layer can be any plating process. Preferably, the plating process is electroplating or electroless plating. More preferably, the plating process is electroplating.

The sulfur-containing compound comprised in the electrolyte solution can be any sulfide. Preferably, the sulfur-containing compound is an organic sulfide surfactant. More preferably, the sulfur-containing compound is an alkyl sulfonate containing disulfide bond. Furthermore, the concentration of the sulfur-containing compound can be appropriately regulated according to the plating conditions and additives comprised in the electrolyte solution. Preferably, the concentration of the sulfur-containing compound is greater than 0 ppm and less than 10 ppm of the electrolyte solution. In one preferred embodiment, the sulfide is bis-(sodium sulfopropyl disulfide).

The composition of the electrolyte solution used in the process for plating a copper layer is not limited. The concentration of each component comprised in the electrolyte solution is not limited. In one preferred embodiment of the present invention, the electrolyte solution can further comprise a polyol, preferably, the polyol is polyethylene glycol, polypropylene glycol, polybutylene glycol, or the combination thereof. Besides, the concentration of the polyol is preferably greater than 0 ppm and less than 100 ppm of the electrolyte solution. In another preferred embodiment, the electrolyte solution included a polyethylene glycol, a bis-(sodium sulfopropyl disulfide), or the combination thereof.

In one preferred embodiment, the method for manufacturing copper wires on a substrate of a flat panel display device can further comprises a step: removing the photoresist layer to expose the underlying seed layer. Subsequently, the exposed seed layer can be removed by etching, and copper wires serving as electrodes or metal conductive lines of a thin film transistor of the substrate can be obtained.

The substrate used in the method for manufacturing conductive copper wires on a substrate of a flat panel display device is not limited. Preferably, the substrate is a silicon substrate, a glass substrate, or a plastic substrate. More preferably, the substrate is used for an active matrix liquid crystal display device such as an undoped silica glass, a phosphorus doped glass (PSG), a boron-phosphorus doped glass, a sodalime glass, a borosilicate glass, a sodium borosilicate glass, an alkali-metal borosilicate glass, an aluminosilicate glass, an aluminoborosilicate glass, an alkaline earth aluminoborosilicate glass, or the combination thereof.

The seed layer used in the method for manufacturing copper wires on a substrate of a flat panel display device can be formed by any conventional process. Preferably, the seed layer is formed by physical vapor deposition, (e.g. ionized metal plasma physical vapor deposition (IMP-PVD)), chemical vapor deposition (e.g. plasma enhanced chemical vapor deposition or thermal chemical vapor deposition), evaporation (e.g. metal evaporation), sputtering (e.g. collimated sputtering, or throw sputtering), or plating (e.g. electroplating, or electroless plating).

The material used to form the seed layer is not limited. Preferably at least one material of the seed layer is selected from the group consisting of gold, silver, copper, nickel, tungsten, molybdenum, cobalt, ruthenium, titanium, zirconium, hafnium, niobium, tantalum, vanadium, chromium, manganese, iron, palladium, platinum, and aluminum. Moreover, alloys, phosphorus or boron-doped derivatives of metals described herein, or materials having the same properties of copper may also be used to form the seed layer.

The seed layer may serve as a conductive layer to inhibit or reduce metal diffusion of the copper wires into the underlying layer, as well as to improve adhesion between the underlying layer and the copper wires.

The patterned photoresist layer on the surface of the seed layer can be formed by any conventional process. Preferably, the photoresist layer is deposited on the surface of the seed layer, and patterned by lithography process. The material of the photoresist layer is not limited. Preferably, the photoresist material is positive photoresist or negative photoresist. Moreover, the energy source used in the lithography process is not limited and depends on the material of the used photoresist layer. For example, ultraviolet light, laser, or e-beam may be used as the energy source.

The method for manufacturing copper wires on a substrate of a flat panel display device further comprises a step: forming a first barrier layer on the surface of the substrate. Preferably, the first barrier layer is deposited on the substrate prior to the deposition of the seed layer. The first barrier layer may prevent the diffusion of alkali ions of the substrate into the seed layer and prevent diffusion of copper and seed layer materials into the underlying substrate. Moreover, a second barrier layer can be selectively formed on the surface of the copper layer after plating a copper layer on the exposed part of the seed layer. The second barrier layer may prevent the diffusion of copper ions. Besides, adhesion between the second barrier layer and copper layer is good, and the subsequent covering process therefore can be easily achieved to obtain conformal step coverage.

The material of the barrier layer is not limited. Preferably, the material of the barrier layer is silicon oxide, silicon nitride, aluminum oxide, tantalum oxide, titanium nitride, indium-tin oxide, silicon carbide, nitrogen and oxygen doped silicon carbide, molybdenum, chromium, titanium, nickel, tungsten, ruthenium, cobalt, phosphorus, or combinations thereof. More preferably, the material of the barrier layer is silicon nitride ($SiN_x(Si_3N_4)$), titanium nitride (TiN), indium-tin oxide (ITO), molybdenum, chromium, titanium, nickel, tungsten, ruthenium, cobalt, phosphorus, or the combinations thereof.

The barrier layer can be formed by any conventional process. Preferably, the barrier layer is formed by physical vapor deposition (e.g. ionized metal plasma physical vapor deposition (IMP-PVD)), chemical vapor deposition (e.g. plasma enhanced chemical vapor deposition or thermal chemical vapor deposition), evaporation (e.g. metal evaporation, sputtering (e.g. collimated sputtering, or throw sputtering), or plating (e.g. electroplating, or electroless plating).

The method illustrate above can be applied for any flat panel display device. Preferably, the method is applied for manufacturing the copper wires (functioned as electrodes or conductive lines of a thin film transistor) on a panel of an active matrix liquid crystal display device.

Other objects, advantages, and novel features of the invention will become more apparent from the following detailed description when taken in conjunction with the accompanying drawings.

DETAILED DESCRIPTION OF THE PREFERRED EMBODIMENT

Embodiment 1

Figure 1:
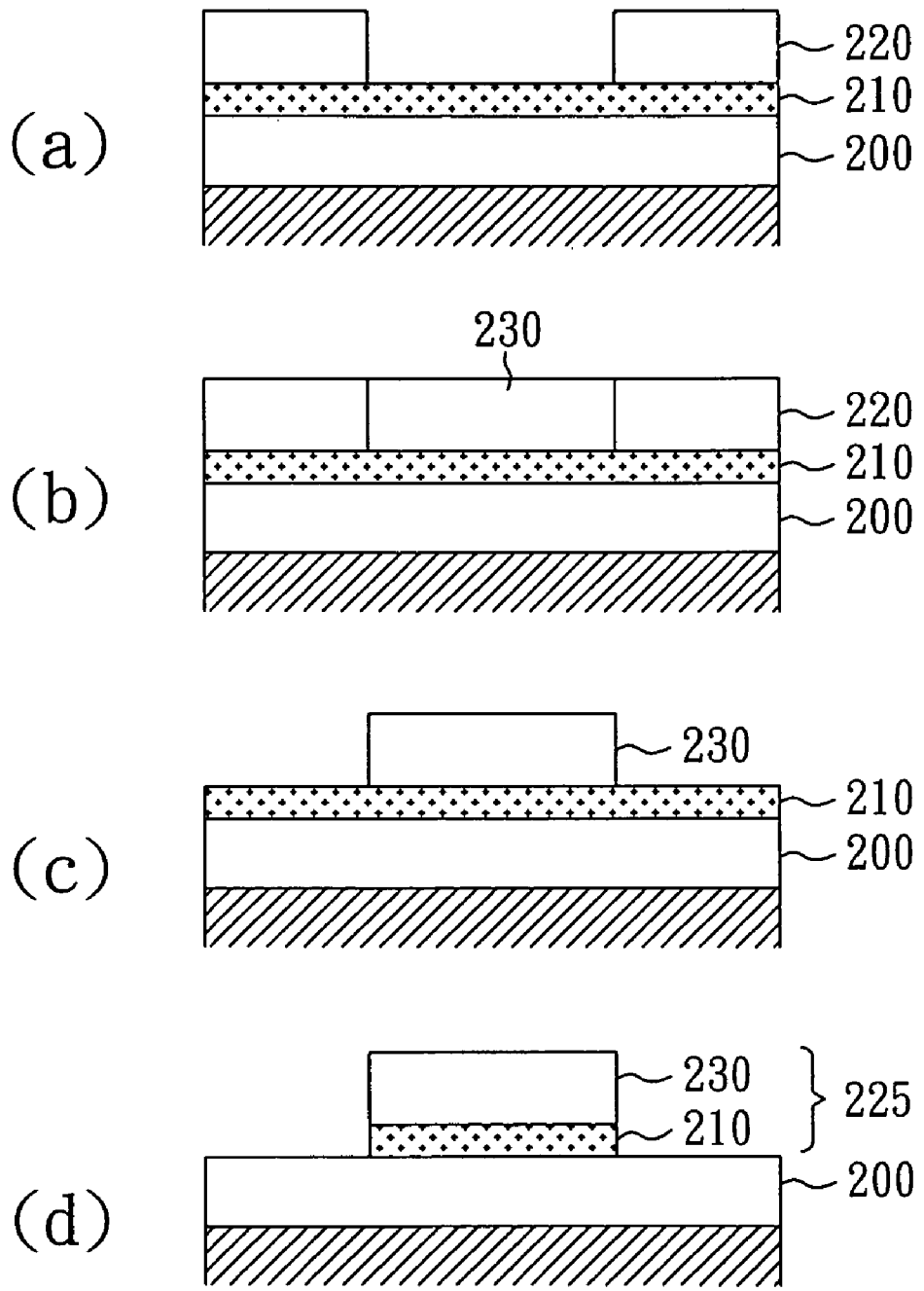
FIG. 1 is a flowchart for manufacturing copper wires according to a conventional method.
Figure 2:
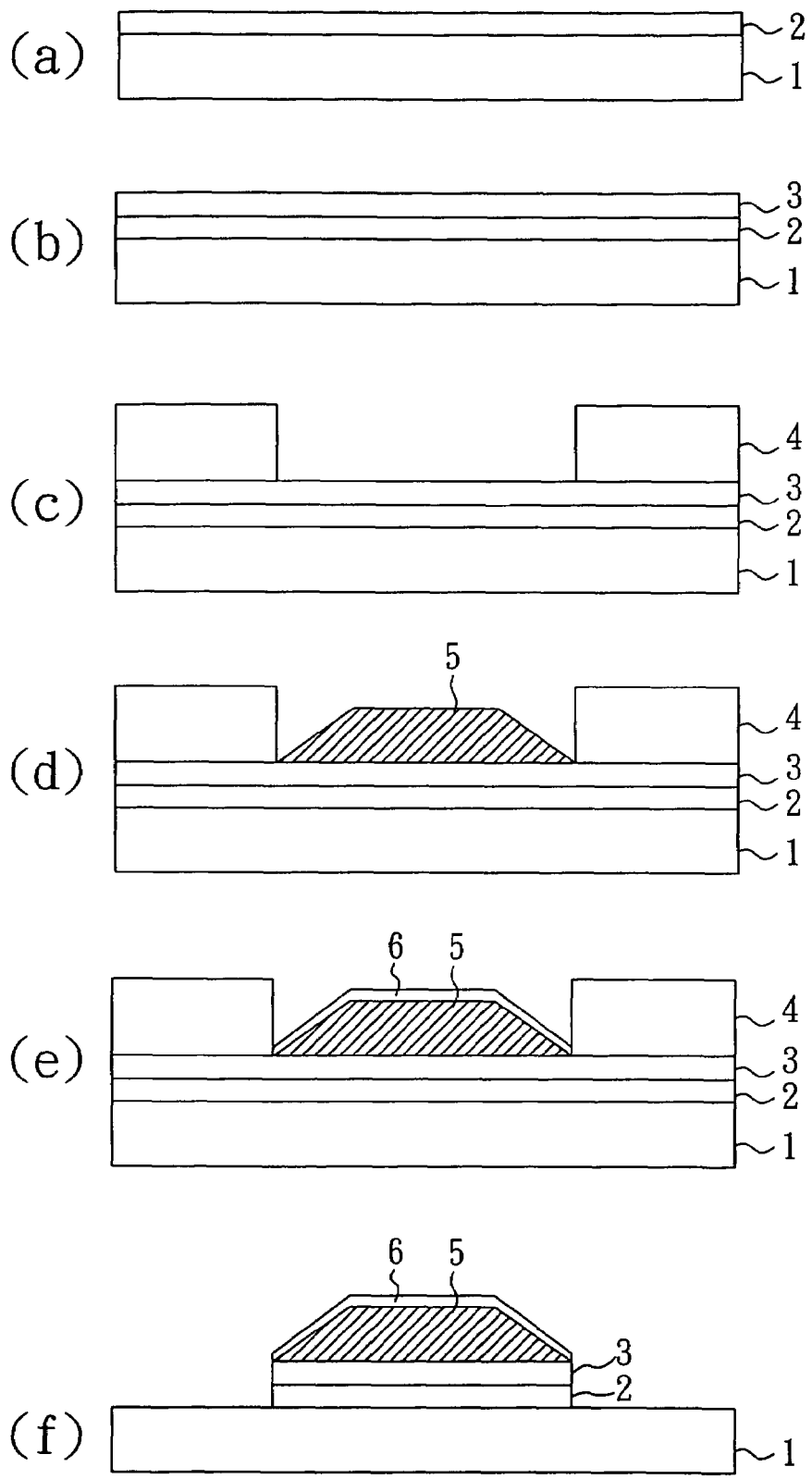
FIG. 2 is a flow chart for manufacturing copper wires according to embodiment 1 of the present invention.

With reference to FIG. 2, there is shown a flowchart for manufacturing copper wires according to a preferred embodiment of the present invention. First, a substrate 1 is provided. A first barrier layer 2 made of silicon nitride (SiN) is formed on the substrate 1 by physical vapor deposition, as shown in FIG. 2(*a*). Next, a seed layer 3 made of copper is deposited on the surface of the first barrier layer 2 by physical vapor deposition, as shown in FIG. 2(*b*). Then, a positive photoresist layer 4 is coated on the surface of the seed layer 3, and patterned to expose a part of the seed layer 3 by photolithography, as shown in FIG. 2(*c*). Subsequently, a copper layer 5 is electroplated on the exposed part of the seed layer with an electrolyte solution comprising a sulfur-containing compound, as shown in FIG. 2(*d*).

The electrolyte solution used in the electroplating process comprises a copper sulfate ($CuSO_4.5H_2O$), sulfuric acid, and chloride ions. Furthermore, the electrolyte solution comprises a surfactant made of bis-(sodium sulfopropyl disulfide with an amount of 0.5 ppm. Thus, the copper layer 5 on the substrate can be formed with a taper. In the electroplating process, the electrical current density is 12 ASF (A/ft$^2$), the time of plating is 70 seconds, and the reaction temperature is 30° C. The taper angle of the resulted copper layer 5 is about 25°.

A second barrier layer 6 made of nickel is deposited on the copper layer 5 by electroless deposition as shown in FIG. 2(d). Subsequently, the photoresist layer 4 is removed to expose a part of the seed layer 3, and the exposed seed layer is then removed from the substrate by etching to form copper wires as shown in FIG. 2(f). The copper wires that may be used as metal conductive lines or electrodes of a thin film transistor are obtained.

Embodiment 2

Figure 3:
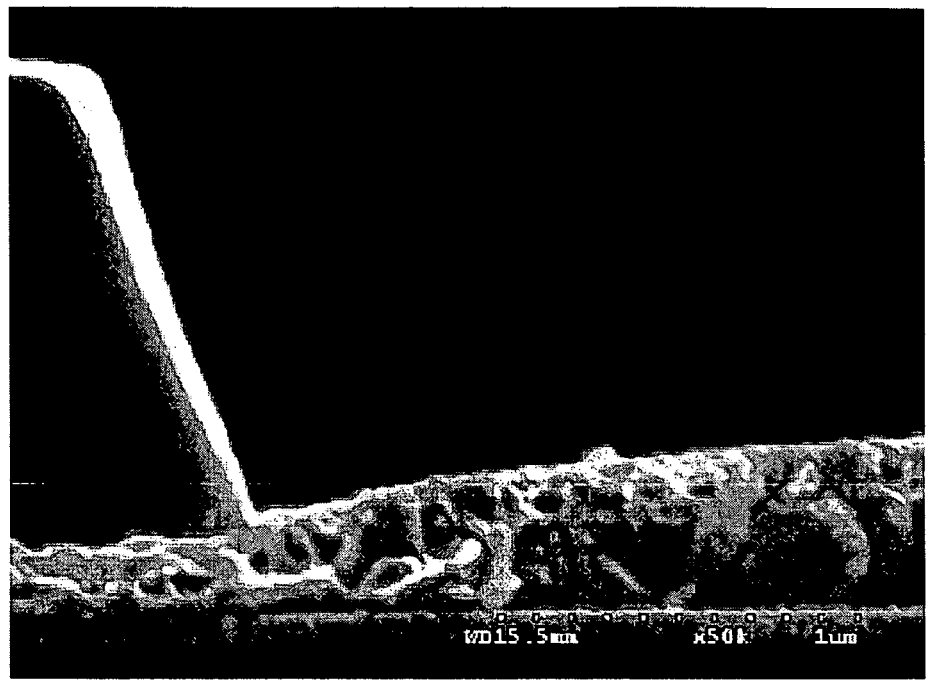
FIG. 3 is an electron microscopy image of the copper wires according to embodiment 2 of the present invention.

The steps of the method for manufacturing copper wires according to embodiment 2 of the present invention are identical to that of embodiment 1, except for the amount of the surfactant of bis-(sodium sulfopropyl disulfide comprised in the electrolyte solution and the electroplating conditions. The concentration of the surfactant used in the present embodiment is about 90 ppm. In the electroplating process, the current density is 8 ASF(A/ft$^2$), the time of plating is 100 seconds, and the reaction temperature is 25° C. FIG. 3 shows an electron microscopic image of the copper layer 5 made according to the steps of the embodiment 2 of the present invention. From the electron microscopic image, the copper layer 5 on the right side of the image is shown to have a taper angle around 25°. Moreover, the photoresist layer 4 can be seen on the left side of the image.

Embodiment 3

The steps of the method for manufacturing copper wires according to embodiment 3 of the present invention are identical to that of embodiment 1, except for the amount of the surfactant, the amount of polyethylene glycol, and the electroplating conditions. The concentration of the surfactant used in the present embodiment is about 0.75 ppm. The concentration of the polyethylene glycol used in the present embodiment is about 10 ppm. In the electroplating process, the current density is 10 ASF(A/ft$^2$), the time of plating is 70 seconds, and the reaction temperature is 30° C. The manufactured copper layer is then investigated by using an electron microscope. From the electron microscopic image, the copper layer is shown to have a taper angle around 50°. Therefore, a smooth copper layer having tapers is obtained by electroplating with an electrolyte solution comprising small amounts of bis-(sodium sulfopropyl disulfide and polyethylene glycol.

Embodiment 4

Figure 4:
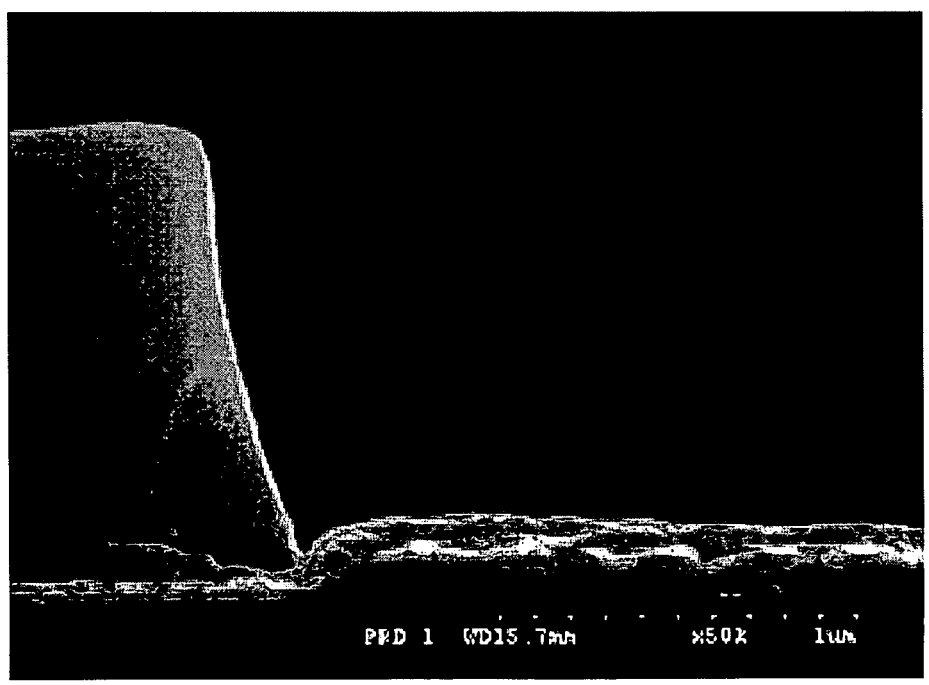
FIG. 4 is an electron microscopy image of the copper wires according to embodiment 4 of the present invention.

The steps of the method for manufacturing copper wires according to embodiment 4 of the present invention are identical to that of embodiment 1, except for the amount of the surfactant, the amount of polyethylene glycol, and the electroplating conditions. The concentration of the surfactant used in the present embodiment is about 25 ppm. The concentration of the polyethylene glycol used in the present embodiment is about 850 ppm. In the electroplating process, the current density is 12 ASF(A/ft$^2$), the time of plating is 70 seconds, and the reaction temperature is 25° C. FIG. 4 shows an electron microscopic image of the copper layer 5 made according to the steps of the embodiment 4 of the present invention. From the electron microscopic image, the copper layer 5 on the right side of the image is shown to have a taper angle around 50° Moreover, the photoresist layer 4 can be seen on the left side of the image.

Comparative Embodiment 1

Figure 5:
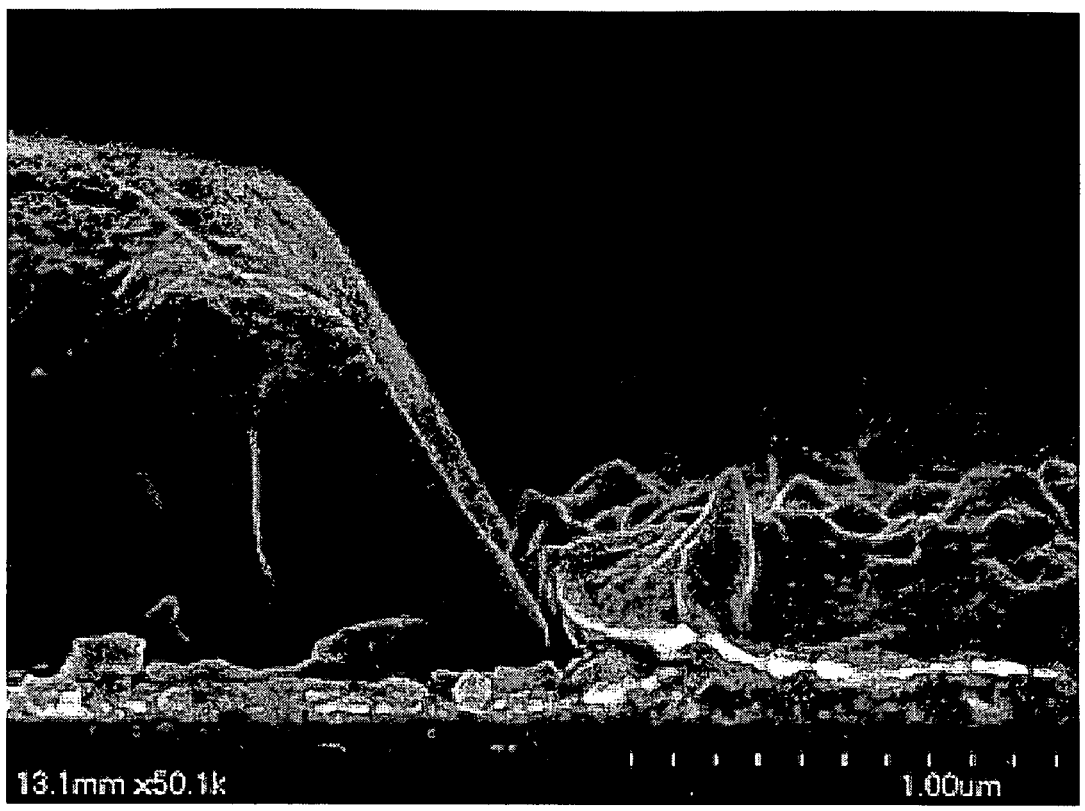
FIG. 5 is an electron microscopy image of the copper wires according to comparative embodiment 1 of the present invention.

The steps of the method for manufacturing copper wires according to comparative embodiment 1 of the present invention are identical to that of embodiment 1, except for the amount of the surfactant made of bis-(sodium sulfopropyl disulfide, and the amount of polyethylene glycol. The amount of the surfactant used in the present embodiment is zero. The concentration of the polyethylene glycol used in the present embodiment is about 100 ppm. FIG. 5 shows an electron microscopic image of the conductive copper layer 5 made according to the steps of the comparative embodiment 1 of the present invention. From the electron microscopic image, the copper layer 5 on the right side of the image is shown to have no taper. Besides, the photoresist layer 4 can be seen on the left side of the image. Therefore, a copper layer having tapers cannot be obtained by electroplating with an electrolyte solution not comprising any sulfur-containing compound, such as bis-(sodium sulfopropyl disulfide).

From the forgoing description, it is obvious that the method of the present invention can manufacture a copper layer with a taper angle under 90° naturally by electroplating with a electrolyte comprising a sulfur-containing compound, such as organic sulfide surfactant. Moreover, the electrolyte can further comprises a polyol to improve the smoothness of the copper layer, and to adjust the taper angle of it.

Although the present invention has been explained in relation to its preferred embodiment, it is to be understood that many other possible modifications and variations can be made without departing from the scope of the invention as hereinafter claimed.

What is claimed is:

1. A method for manufacturing copper wires on a substrate of a display device comprising the following steps:
    (a) providing a substrate;
    (b) forming a seed layer on the surface of the substrate;
    (c) forming a patterned photoresist layer on the surface of the seed layer to expose a part of the seed layer; and
    (d) plating a copper layer on the exposed part of the seed layer with an electrolyte solution comprising a sulfur-containing compound;
    wherein the angle between the surface of the copper layer and the contact surface of the seed layer is greater than 0 degree and less than 90 degree.

2. The method as claimed in claim 1, further comprising step (e) removing the photoresist layer after plating the copper layer in step (d).

3. The method as claimed in claim 1, wherein the patterned photoresist layer is formed through depositing photoresist layer on the surface of the seed layer, and patterning the photoresist by photolithography in step (c).

4. The method as claimed in claim 1, wherein the seed layer is formed by physical vapor deposition, chemical vapor deposition, evaporation, sputtering, electroplating or electroless deposition in step (b).

5. The method as claimed in claim 1, wherein the electrolyte solution further comprises a polyol.

6. The method as claimed in claim 5, wherein the polyol is polyethylene glycol, polypropylene glycol, polybutylene glycol, or the combination thereof.

7. The method as claimed in claim 1, wherein the sulfur-containing compound is an organic sulfide surfactant.

8. The method as claimed in claim 7, wherein the sulfur-containing compound is an alkyl sulfonate having disulfide groups.

9. The method as claimed in claim 1, further comprising step (a1) forming a first barrier layer on the surface of the substrate after the substrate is provided in step (a).

10. The method as claimed in claim 9, wherein at least one material of the first barrier layer is selected from the group consisting of silicon oxide, silicon nitride, aluminum oxide, tantalum oxide, titanium nitride, indium-tin oxide, silicon carbide, nitrogen and oxygen doped silicon carbide, molybdenum, chromium, titanium, nickel, tungsten, ruthenium, cobalt, and phosphorus.

11. The method as claimed in claim 1, further comprising step (d1) forming a second barrier layer on the surface of the copper layer after the copper layer is plated in step (d).

12. The method as claimed in claim 11, wherein at least one material of the second barrier layer is selected from of the group consisting of silicon oxide, silicon nitride, aluminum oxide, tantalum oxide, titanium nitride indium-tin oxide, silicon carbide, nitrogen and oxygen doped silicon carbide, molybdenum, chromium, titanium, nickel, tungsten, ruthenium, cobalt, and phosphorus.

13. The method as claimed in claim 11, wherein the second barrier layer is formed by physical vapor deposition, chemical vapor deposition, evaporation, sputtering, electroplating, or electroless deposition.

14. The method as claimed in claim 1, wherein the angle between the surface of the copper layer and the contact surface of the seed layer is greater than 10 degree and less than 80 degree.

15. The method as claimed in claim 1, wherein at least one material of the seed layer is selected from of the group consisting of gold, silver, copper, nickel, tungsten, molybdenum, cobalt, ruthenium, titanium, zirconium, hafnium, niobium, tantalum, vanadium, chromium, manganese, iron, palladium, platinum, and aluminum.

16. The method as claimed in claim 1, wherein the photoresist layer is positive photoresist layer, or negative photoresist layer.

17. The method as claimed in claim 1, wherein the copper layer is plated by electroplating, or electroless deposition.

18. The method as claimed in claim 1, wherein the substrate is a silicon substrate, a glass substrate, or a plastic substrate.

19. The method as claimed in claim 1, wherein two angles between the surface of the copper layer and the contact surface of the seed layer are located at the lateral side of the copper layer, and are greater than 0 degree and less than 90 degree.

20. The method as claimed in claim 19, wherein the angles are greater than 10 degree and less than 80 degree.

* * * * *